United States Patent [19]

Taniguchi et al.

[11] Patent Number: 5,162,756
[45] Date of Patent: Nov. 10, 1992

[54] HIGH FREQUENCY TRANSMISSION LINE CIRCUIT

[75] Inventors: Yasuichi Taniguchi, Yokohama; Shintaro Takase, Sagamihara, both of Japan

[73] Assignee: Fujitsu Limited, Kawasaki, Japan

[21] Appl. No.: 599,449

[22] Filed: Oct. 18, 1990

[30] Foreign Application Priority Data

Oct. 20, 1989 [JP] Japan ................................ 1-273976

[51] Int. Cl.$^5$ ........................... H03F 3/68; H01P 5/12
[52] U.S. Cl. .................................. 330/295; 333/127; 333/128
[58] Field of Search .................... 333/33, 35, 127, 128; 330/295

[56] References Cited

U.S. PATENT DOCUMENTS 4,785,267 11/1987 Covill .................................. 333/125
4,968,958 11/1990 Hoare ................................. 333/128

FOREIGN PATENT DOCUMENTS

EP0333247A1 9/1989 European Pat. Off. .
070731 6/1977 Japan .................................. 333/128
57-197902A 12/1982 Japan .

OTHER PUBLICATIONS

Webb, *Power Divider/Combiners: Small Size, Big Specs*, Microwaves, Nov. 1981, vol. 20, No. 12, pp. 67–74.

K. B. Niclas, Planar Power Combining for Medium Power GaAs FET Amplifiers in X/KU-Bands, Jun. 1979, Microwave Journal, vol. 22, No. 6, pp. 79–84, Palto, Calif.

B. Kim et al., 35 GHZ GaAs Power MOSPET—s and Monolithic Amplifiers, Sep. 1989, IEEE Transactions on Microwave Theory and Techniques, vol. 37, No. 9, pp. 1327–1329, New York US.

J. A. Benjamin, Use Hybrid Junctions for more VHF Power, Aug. 1, 1968, Electronic Design, vol. 16, No. 16, pp. 54–59, West Palm Beach, Florida.

G. Chen et al., Two-Section Impedance Transformer with Arbitrary Length, Dec. 1987, International Journal of Electronics, vol. 63, No. 6, pp. 911–920, London, Great Britain.

Y Taniguchi et al., A C-Band 25 Watt Linear Power FET, May 8–10, 1990, IEEE MTT-S International Microwave Symposium-Digest, vol. 111, pp. 981–984, New York, US.

Ha, Tri T., *Solid-State Microwave Amplifier Design*, Chapter 6, copyright 1981, pp. xiii–xiv, 248 and 253–267.

Primary Examiner—Paul Gensler
Attorney, Agent, or Firm—Staas & Halsey

[57] ABSTRACT

A high frequency transmission line circuit including a plurality of units each constituting two transmission lines connected in common through one end of each, the other ends being independent, one end of a latter stage of units being connected to the other ends of a former stage so as to form a tournament configuration, the length of the transmission lines being made less than $\lambda/4$ ($\lambda$ being one wavelength of a frequency of a high frequency signal), and the characteristic impedances of the transmission lines in units at an end side of the tournament are set larger than the characteristic impedances of the transmission lines in the units at the peak side of the tournament such that each two parallely arranged adjoining units at the end side of the tournament configuration are joined, at their commonly connected ends, to the adjoining unit at the peak side thereof, so as to reduce the total length of the device.

8 Claims, 7 Drawing Sheets

HIGH FREQUENCY TRANSMISSION LINE CIRCUIT

BACKGROUND OF THE INVENTION

1. Field of the Invention

The present invention relates to a high frequency transmission line circuit, more particularly to a high frequency transmission line circuit suitable for mounting on a microwave integrated circuit (MIC).

In recent years, along with the spread of car telephones and hand-held cordless telephones, a demand has arisen for high frequency related circuits of a greater performance, low cost, and high reliability, for example, high frequency amplifying circuits. The MICs constituted as so-called printed circuits are suitable for automated production lines, are small in size, and are superior in reliability as well and have been made much use of in various fields in recent years, including the above applications.

As a method for improving the performance of high frequency amplifying circuits, the practice has been to divide the input signals for a plurality of rows of amplifiers comprised of GaAsFETs, for example, to amplify them for each row, and then combine them so as to produce the high power output.

This division and combination, however, requires a high frequency transmission line circuit split into a tree-like configuration. Such a high frequency transmission line circuit connected to the inputs of the plurality of amplifier rows is generally called a power divider, while a high frequency transmission line circuit connected to the outputs of the plurality of the amplifier rows is generally called a power combiner.

2. Description of the Related Art

As a power divider/combiner built by a high frequency transmission line circuit, there has been known the one called the Wilkinson type. This, as explained in detail later, has as one unit two parallel high frequency transmission lines and one isolation resistor. Ends, one each, of the two high frequency transmission lines are connected in common, while the other ends are independent, but are mutually connected by the isolation resistor. The actual Wilkinson type power divider/combiner has a plurality of the above units connected in tandem in a tournament configuration as shown in FIG. 1. In this case, the lengths of the high frequency transmission lines of each unit are $\lambda/4$, where $\lambda$ is the wavelength of the frequency of the high frequency signal passing through the unit.

As mentioned above, the length of the conventional high frequency transmission lines was $\lambda/4$. When one and two stages of such units were connected in tandem, the total length therefore became $\lambda/4$ and $\lambda/2$. In other words, in the conventional high frequency signal power divider/combiner, each of the high frequency transmission lines had a length of $\lambda/4$, so the distance between input-output ports in the case of a 1→4 division (or 4→1 combination) had to be $\lambda/4+\lambda/4=\lambda/2$ (that is, half wavelength). When considering, in particular, mounting in an MIC, this has to be improved in the sense of size reduction.

The simplest method conceivable for reducing the size would be to shorten the length $\lambda/4$ of the high frequency transmission lines to $\lambda/8$ or $\lambda/16$ or the like, but even if the length of the high frequency transmission lines was shortened, a practical power divider/combiner could not be realized. When the length of the high frequency transmission lines is made $\lambda/4$, it is easy to make the input impedance of the line and the output impedance thereof the same as the corresponding external impedances ($Z_S$, $Z_L$) respectively and, therefore, it is easy to achieve impedance matching between the input and output of the transmission lines.

If the length of the high frequency transmission lines were made less than $\lambda/4$ to reduce size by the above method, however, it would become impossible to achieve the above impedance matching.

SUMMARY OF THE INVENTION

Therefore, the object of the present invention is to provide a high frequency signal transmission line circuit made compact in total length and, in particular, suitable for an MIC, for example, a power divider/combiner.

To achieve the above object, the present invention provides a high frequency transmission line circuit which includes a plurality of units arranged in a tournament configuration, each unit constituting a pair of two transmission lines, the pair of transmission lines of each of the units being connected in common through one end of each, the other ends of the transmission lines being independent, the length of the transmission lines being made less than $\lambda/4$, and the characteristic impedances of any two transmission lines adjoiningly connected along a direction of passage of a high frequency signal being set such that the characteristic impedance of the transmission line at the end side of the tournament configuration is larger than the characteristic impedance of the transmission line at the peak side of the tournament configuration, so that each two parallely arranged adjoining units at the end side of the tournament configuration are joined, at their commonly connected ends, to the adjoining unit at the peak side thereof.

BRIEF DESCRIPTION OF THE DRAWINGS

The above objects and features of the present invention will be more apparent from the following description of the preferred embodiments with reference to the accompanying drawings, wherein.

DESCRIPTION OF THE PREFERRED EMBODIMENTS

Before describing the embodiments of the present invention, the related art and the disadvantages therein will be described with reference to the related figures.

Figure 1:
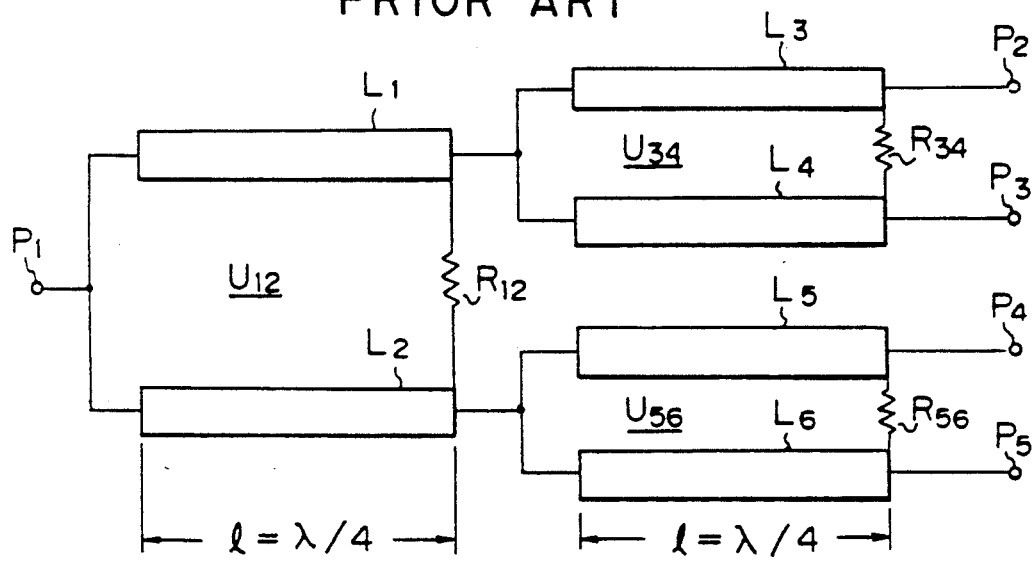
FIG. 1 is a plan view of the constitution of a conventional high frequency transmission line circuit.

FIG. 1 is a plan view of the constitution of a conventional high frequency transmission line circuit. The high frequency transmission line circuit of the figure is one assembled as a high frequency signal power divider/combiner.

If the high frequency signal is applied to a port $P_1$ and taken out from the ports $P_2$ to $P_5$, this circuit functions as a 1→4 divider, while if the high frequency signal is applied to the ports $P_2$ to $P_5$ and taken out from the port $P_1$, it functions as a 4→1 combiner.

Such a high frequency signal power divider/combiner is one known as the Wilkinson type and has six transmission lines $L_1$ to $L_6$ connected in a tournament configuration. For each transmission line, use is made of a transformer having a wavelength one-fourth of the frequency of the signal passing therethrough ($\lambda/4$, where $\lambda$ is one wavelength). Further, in the figure, $R_{12}$, $R_{34}$, and $R_{56}$ are isolation resistors.

Analyzing the power divider/combiner of FIG. 1 a bit more, it is constructed of a plurality of units U, each made of two parallel high frequency transmission lines and a single isolation resistor, connected in tandem in a tournament configuration. These units are shown by $U_{12}$, $U_{34}$, and $U_{56}$ in the figure. All the units have the same construction, so looking, for example, at unit $U_{34}$, ends, one each, of the two transmission lines $L_3$ and $L_4$ (in the figure, the left ends) are connected mutually in common, while the other ends (in the figure, the right ends) are independent. However, an isolation resistor $R_{34}$ is connected between the other ends.

Such a high frequency transmission line circuit has transmission lines $L_1, L_2, \ldots L_6$ with lengths of $\lambda/4$, so, as mentioned before, impedance matching between the input side impedances and the output side impedances can be easily realized and therefore an ideal power divider/combiner can be obtained.

On the other hand, however, since the transmission lines $L_1, L_2, \ldots L_6$ have lengths of $\lambda/4$, the overall length of the high frequency transmission line circuit becomes longer and reduction of size becomes impossible. For example, if the frequency of the high frequency signal passing through the high frequency transmission line circuit is 4 to 5 GHz, the length between the port $P_1$ and the ports $P_2$ to $P_6$ in FIG. 1 would become about 3 mm in case where a substrate having the dielectric constant of 10($\epsilon=10$), e.g. alumina substrate is used. In this case the present invention has this made a length of about 1.5 mm.

Figure 2:
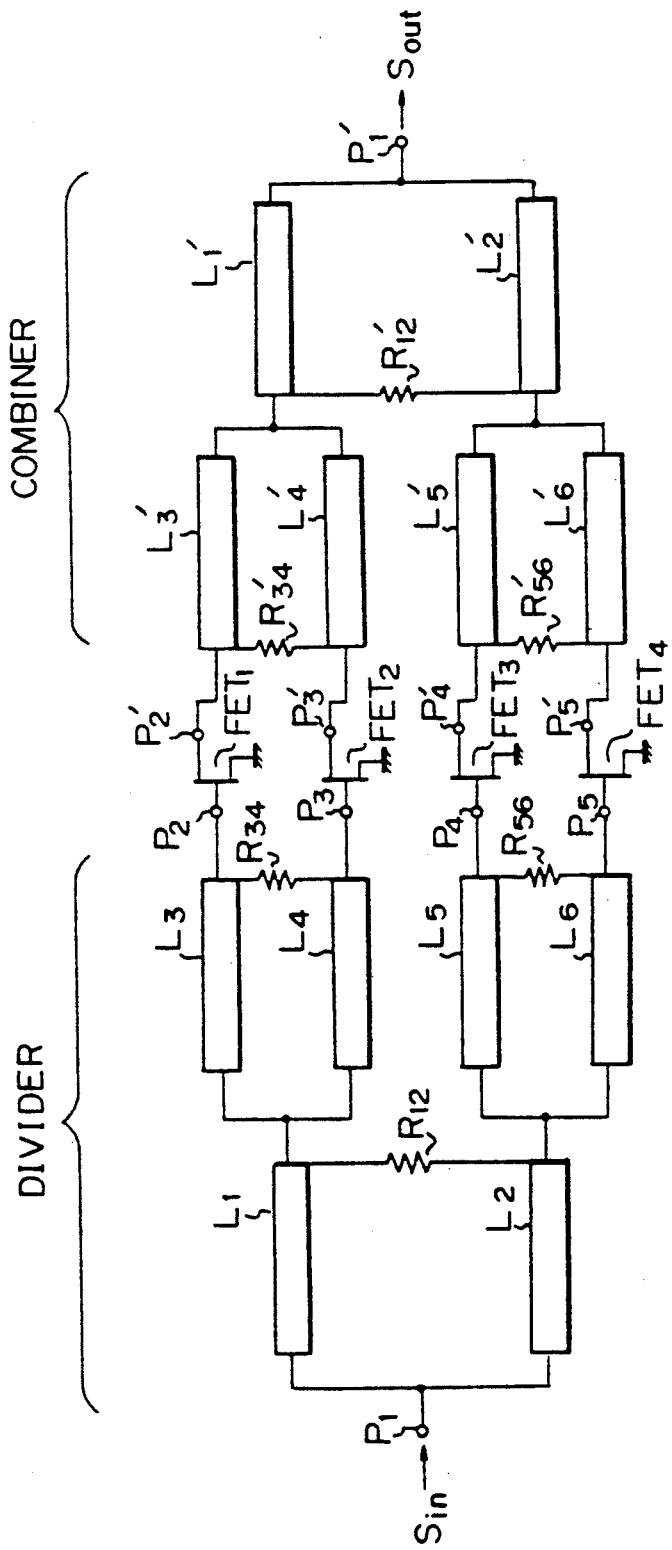
FIG. 2 is a view of the overall constitution of a general power divider/combiner.

FIG. 2 is a view of the overall constitution of a general power divider/combiner. This power divider/combiner uses four high frequency amplifiers (FETs) $FET_1$ to $FET_4$ to amplify the input high frequency signal $S_{in}$ and obtain a high power high frequency signal $S_{out}$. At the input sides of the high frequency amplifiers $FET_1$ to $FET_4$ are provided dividers for dividing the signal $S_{in}$, while at the output sides are provided combiners for combining the amplified signals $S_{in}$.

Figure 3:
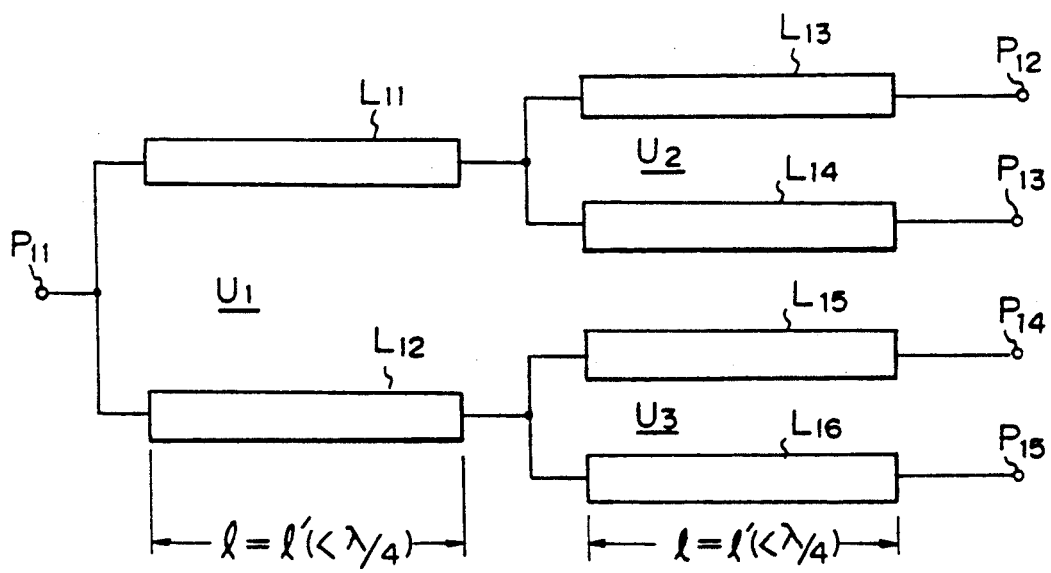
FIG. 3 is a view of the main constitution of the present invention.

FIG. 3 is a view of the main constitution of the present invention. The high frequency transmission line circuit of the present invention is constructed of a plurality of units arranged in a tournament configuration, each unit (U) including a pair of transmission lines. In the figure, the example is shown of arrangement of three units $U_1$, $U_2$, and $U_3$. The units $U_1$, $U_2$, and $U_3$ are each constituted by pairs of two transmission lines $L_{11}$ and $L_{12}$, $L_{13}$ and $L_{14}$, and $L_{15}$ and $L_{16}$.

The pairs of the transmission lines ($L_{11}$, $L_{12}$; $L_{13}$, $L_{14}$; $L_{15}$, $L_{16}$) of the units ($U_1$, $U_2$, $U_3$) have one side ends connected in common and the other ends independent.

The length l of the transmission lines is l', where l' is shorter than $\lambda/4$ (l'$<\lambda/4$).

Further, the characteristic impedances of any two transmission lines adjoiningly connected along a direction of passage of a high frequency signal (from the right side to the left side in the figure or the other way), i.e., $L_{11} \leftrightarrow L_{13}$, $L_{11} \leftrightarrow L_{14}$, $L_{12} \leftrightarrow L_{15}$, and $L_{12} \leftrightarrow L_{16}$, are set so that the characteristic impedance of the transmission line at the end side of the tournament configuration is larger than the characteristic impedance of the transmission line at the peak side of the tournament configuration. For example, if the characteristic impedance of the transmission lines $L_{11}$ and $L_{12}$ of the unit $U_1$ is made $Z_1$, the characteristic impedance of the transmission lines $L_{13}$ and $L_{14}$ of the unit $U_2$ is made $Z_2$, and the characteristic impedance of the transmission lines $L_{15}$ and $L_{16}$ of the unit $U_3$ is made $Z_3$, then $Z_1 < Z_2$ and $Z_1 < Z_3$.

Note that in FIG. 3, the sum of the length l' of the unit $U_1$ and the lengths l' of the units $U_2$ and $U_3$, that is, l'+l', is set to $\lambda/4$.

In the final analysis, the impedance mismatching occurring due to the lengths of the transmission lines being less than $\lambda/4$ can be reduced by adjusting the characteristic impedances of the transmission lines.

Figure 4:
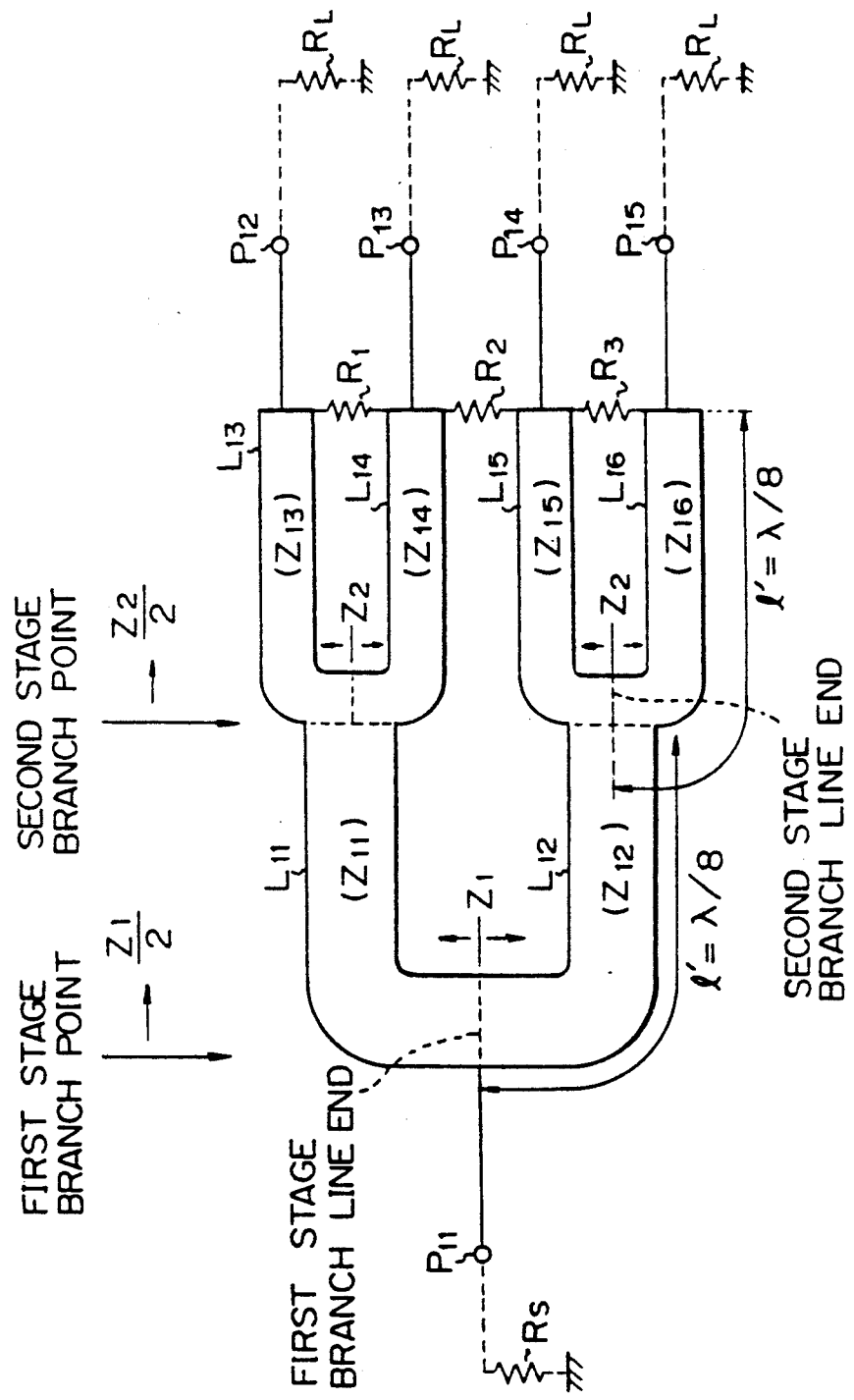
FIG. 4 is a plan view of a first embodiment of the present invention.

FIG. 4 is a plan view of a first embodiment of the present invention. In the first embodiment of the present invention, the case is shown where the length l' shown in FIG. 1 ($<\lambda/4$) is made $\lambda/4n$ (where n is 2, 3, 4 ... ), in particular the case where n is 2. That is, if transmission lines of a length corresponding to $\lambda/8$ are connected in a tournament configuration and, for example, 1→4 division is performed (or 4→1 combination), the length between, input-output ports becomes $\lambda/8 + \lambda/8 = \lambda/4$.

Therefore, if use is made of the high frequency transmission line circuit of FIG. 4, then the length becomes about half that compared with the conventional case mentioned above and, in particular, a high frequency signal power divider/combiner suitable for an MIC can be realized.

In FIG. 4, $P_{11}$ to $P_{15}$ are ports, and the transmission lines are formed branched in a tournament configuration from one port P11 to the other four ports $P_{12}$ to $P_{15}$. The transmission lines are formed as microstrip lines when on an MIC. The microstrip lines are set to have a length of each of the branch portions of the tournament configuration of one-eighth the wavelength of the frequency of the signal passing therethrough ($\lambda/8$ wavelength, where $\lambda$ is one wavelength). These branch portions formed every $\lambda/8$ wavelength form the transmission lines $L_{11}$ to $L_{16}$.

The characteristic impedances $Z_{11}$ to $Z_{16}$ of the transmission lines $L_{11}$ to $L_{16}$ are set as follows: That is, if the impedance of the port $P_{11}$ side (corresponding to the impedance of the high frequency signal source ($S_{in}$ in FIG. 2) if used as a divider) is $R_S$ and the impedance of the port $P_{12}$ to $P_{15}$ side (corresponding to the load impedances (FETs in FIG. 2) if used as a combiner) is $R_L$ and, for example, $R_S = R_L = 50$ $\Omega$, then the characteristic impedances $Z_{11}$ and $Z_{12}$ are set to $$\sqrt{R_S R_L} = 50\Omega$$

and the characteristic impedances $Z_{13}$ to $Z_{16}$ are set to $$2\sqrt{R_S R_L} = 100\Omega$$

Note that $R_1$ to $R_3$ in the figure are isolation resistors and for example $R_1 = R_3 = 73\ \Omega$ and $R_2 = 46\ \Omega$.

In the construction in FIG. 4, the impedances at the branching points are given by the following equation (1) as conditions for matching:

$$R_S = \frac{Z_1}{2}$$
$$Z_1 = Z_{01} \frac{\frac{Z_2}{2} + jZ_{01}\tan\frac{\pi}{4}}{Z_{01} + j\frac{Z_2}{2}\tan\frac{\pi}{4}} \quad (1)$$
$$Z_2 = Z_{02} \frac{R_L + jZ_{02}\tan\frac{\pi}{4}}{Z_{02} + jR_L\tan\frac{\pi}{4}}$$

where, $Z_{01}$: characteristic impedances ($Z_{11}$ and $Z_{12}$) of first stage transmission lines $L_{11}$ and $L_{12}$ $Z_{02}$: characteristic impedances ($Z_{13}$ to $Z_{16}$) of second stage transmission lines $L_{13}$ to $L_{16}$ $Z_1$: impedance of first stage branched line port seen from sending port side (high frequency signal source side)

$Z_2$: impedance of second stage branched line port seen from sending port side

If the impedance of the $P_{11}$ side (impedance of high frequency signal source if used as a divider) $R_S$ and the impedance of the $P_{12}$ to $P_{15}$ side (load impedance if used as a divider) $R_L$ are considered pure resistors and the transmission line is considered to have no loss (the loss is extremely small) and the characteristic impedances $Z_{01}$ and $Z_{02}$ are considered pure resistors, the following equation (1)' is obtained from the above equation (1):

$$Z_{01} = \frac{2R_L R_S}{Z_{02}} \quad (1)'$$
$$Z_{02} = 2Z_{01}$$

Here, a detailed explanation will be given of the process of derivation of the above equation (1)'. The matching conditions are made the following equations (2) and (3):

$$2R_S = Z_1 = Z_{01} \frac{\frac{Z_2}{2} + jZ_{01}}{Z_{01} + j\frac{Z_2}{2}} \quad (2)$$
$$(\because \tan \pi/4 = 1)$$

$$Z_2 = Z_{02} \frac{R_L + jZ_{02}}{Z_{02} + jR_L} \quad (3)$$
$$(\because \tan \pi/4 = 1)$$

$Z_{01}$ and $Z_{02}$ are found by these condition equations (2) and (3), and equation (2) is developed.

$$2R_S Z_{01} + jR_S Z_2 + \frac{Z_{01}Z_2}{2} + jZ_{01}^2$$

$$Z_{01}(2R_S - jZ_{01}) = Z_2\left(\frac{Z_{01}}{2} - jR_S\right) \quad (2)'$$

Substituting equation (3) in equation (2)', the following is obtained:

$$Z_{01}(2R_S - jZ_{01}) = Z_{02}\frac{R_L + jZ_{02}}{Z_{02} + jR_L}\left(\frac{Z_{01}}{2} - jR_S\right)$$

$$Z_{01}(2R_S - jZ_{01})(Z_{02} + jR_L) = Z_{02}(R_L + jZ_{02})\left(\frac{Z_{01}}{2} - jR_S\right)$$

$$[F_1] + [J_1] = [F_2] + [J_2] \quad (4)$$

where,
$[F_1]$: $Z_{01}(2R_S Z_{02} + R_L Z_{01})$
$[J_1]$: $jZ_{01}(2R_S R_L - Z_{01}Z_{02})$
$[F_2]$: $Z_{02}\{(R_L Z_{01})/2 + R_S Z_{02}\}$
$[J_2]$: $jZ_{02}\{(Z_{01}Z_{02})/2 - R_S R_L\}$ If the signal source impedance $R_S$ and the load impedance $R_L$ are considered pure resistors and the transmission line is considered to be of no loss, in particular the characteristic impedances $Z_{01}$ and $Z_{02}$ are considered to be pure resistors, then the $[F_1]$ and $[F_2]$ of the above equation (4) show the real part and $[J_1]$ and $[J_2]$ the imaginary part. Therefore, if the two sides of equation (4) are compared, $$Z_{01}(2R_S Z_{02} + R_L Z_{01}) = Z_{02}\left(\frac{R_L Z_{01}}{2} + R_S Z_{02}\right) \quad (5)$$

$$Z_{01}(2R_S R_L - Z_{01}Z_{02}) = Z_{02}\left(\frac{Z_{01}Z_{02}}{2} - R_S R_L\right) \quad (6)$$

From equation (5), $$2R_S Z_{01}Z_{02} + R_L Z_{01}^2 = \frac{R_L Z_{01}Z_{02}}{2} + R_S Z_{02}^2$$

$$2Z_{01}\left(R_S Z_{02} + \frac{R_L Z_{01}}{2}\right) = Z_{02}\left(R_2 Z_{02} + \frac{R_L Z_{01}}{2}\right)$$

$$Z_{02} = 2Z_{01} \quad (5)'$$

If equation (5)' is substituted in equation (6), $$Z_{01}(2R_S R_L - Z_{02}2Z_{01}) = 2Z_{01}\left(\frac{Z_{01}2Z_{01}}{2} - R_S R_L\right)$$

$$R_S R_L - Z_{01}^2 = Z_{01}^2 - R_S R_L$$

$$Z_{01} = \sqrt{R_S R_L} \quad (7)$$

If equation (7) is substituted in equation (5)', $$Z_{02} = 2\sqrt{R_S R_L}$$

or from equation (6)

$$2R_S R_L Z_{01} - Z_{01}^2 Z_{02} = \frac{Z_{01} Z_{02}^2}{2} - R_S R_L Z_{02}$$

$$Z_{01} Z_{02}\left(Z_{01} + \frac{Z_{02}}{2}\right) = 2R_S R_L \left(Z_{01} + \frac{Z_{02}}{2}\right)$$

$$Z_{01} = \frac{2R_S R_L}{Z_{02}}$$

From equations (5)' and (6)', the following are derived:

$$Z_{01} = \sqrt{R_S R_L}$$

$$Z_{02} = 2\sqrt{R_S R_L}$$

Therefore, if the characteristic impedances $Z_{11}$ and $Z_{12}$ of the first stage transmission lines $L_{11}$ and $L_{12}$ are set at $$\sqrt{R_S R_L}$$

and the characteristic impedances of the second stage transmission lines $L_{13}$ to $L_{16}$ are set at $$2\sqrt{R_S R_L}$$

it is possible to obtain a match between the high frequency signal source and load (in general conversion from pure resistors to pure resistors). For example, if $R_S = R_L = 50\ \Omega$, the characteristic impedances $Z_{11}$ and $Z_{12}$ of the first stage transmission lines $L_{11}$ and $L_{12}$ may be made 50 $\Omega$ and the characteristic impedances $Z_{13}$ to $Z_{16}$ of the second stage transmission lines $L_{13}$ to $L_{16}$ may be made 100 $\Omega$. Alternatively, if $R_S = 50\ \Omega$ and $R_L = 25\ \Omega$, the characteristic impedances $Z_{11}$ and $Z_{12}$ of the first stage transmission lines $L_{11}$ and $L_{12}$ may be made 35.35 $\Omega$ and the characteristic impedances $Z_{13}$ to $Z_{16}$ of the second stage transmission lines $L_{13}$ to $L_{16}$ may be made 70.7 $\Omega$.

As mentioned above, in the first embodiment, it is possible to perform 1→4 division or 4→1 combination without problem by impedance matching, with low loss, between one port $P_{11}$ and the other four ports $P_{12}$ to $P_{15}$.

Further, in the first embodiment, the lengths of the transmission lines $L_{11}$ to $L_{16}$ are made $\lambda/8$, so the length between the input and output ports, specifically the length between the one port $P_{11}$ and the other four ports $P_{12}$ to $P_{15}$ may be made $\lambda/4$, about half the length compared in the conventional case. As a result, the circuit can be made compact and, in particular, it is possible to realize a high frequency signal power divider/combiner superior in mountability in an MIC.

Figure 5:
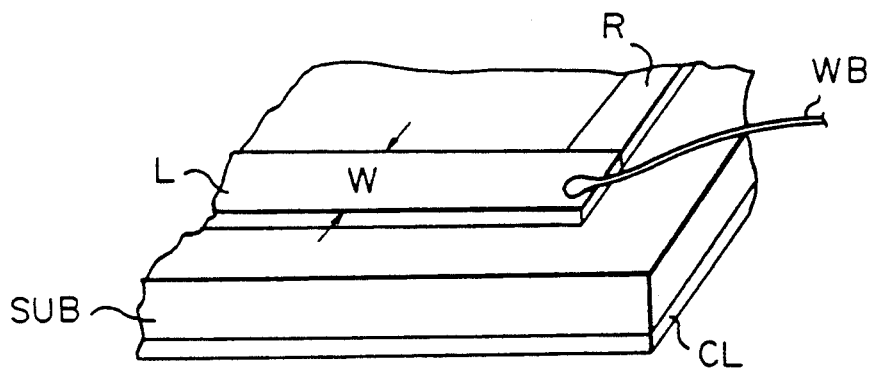
FIG. 5 is a perspective view showing in detail a portion of the constitution of FIG. 4.

FIG. 5 is a perspective view showing in detail a portion of the constitution of FIG. 4. This shows the example of constitution in the form of an MIC. The L in the FIG. 5 shows a transmission line and corresponds, for example, to the part of L16 of FIG. 4. This transmission line L is a microstrip line. Further, the R in FIG. 5 is an isolation resistor and corresponds, for example, to part of the $R_3$ of FIG. 4. This isolation resistor R is made of a sheet resistor film. The end portion of the transmission line L is connected through wire bonding WB to other circuit portions, for example, to the input port or output port of an FET or an input signal source.

These transmission lines L etc. are formed on an insulating substrate, for example, an alumina substrate ($Al_2O_3$) SUB. At the bottom of the entire alumina substrate SUB is formed as a ground a conductor layer CL.

One of the points of the present invention is that the characteristic impedances of the transmission lines are made different between the first stage transmission lines and the second stage transmission lines. These characteristic impedances can be adjusted by suitably selecting the widths W of the transmission lines L in FIG. 5. In general, the characteristic impedance of a transmission line L changes depending on factors such as the thickness of the alumina substrate SUB, the dielectric constant ($\epsilon$) of the alumina substrate, and the width of the transmission line (W in FIG. 5). In this case, the factors other than the width W are fixed and cannot be adjusted, so the value of the characteristic impedance is made $$\sqrt{R_S R_L} : 2\sqrt{R_S R_L}$$

by setting the width W to $W_1:W_2=2:1$. Alternatively, if some of the units are mounted on different substrates, it is also possible to adjust other physical factors other than the width W, for example the thickness of the substrate and the dielectric constant ($\epsilon$) thereof.

Here, a comparison will be made between the transmission line of the first embodiment and the transmission line of the conventional example. The length of the transmission line in the first embodiment is $\lambda/8$ compared to $\lambda/4$ for the conventional example. If one simply compares the lengths, it will seem that the conventional transmission line has simply been halved, but the first embodiment not only limits the length but also the relationship of the characteristic impedances. That is, the characteristic impedance of the one transmission line (for example, $L_{12}$) connected to two transmission lines (for example, $L_{15}$ and $L_{16}$) is made one-half the characteristic impedances (for example, $Z_{15}$ or $Z_{16}$) of the two transmission lines. This enables matching without loss between the $\lambda/8$ length $L_{12}$ and the $\lambda/8$ lengths $L_{15}$ and $L_{16}$ in the case of the first embodiment.

As opposed to this, when the transmission line of the conventional example is simply made half the length, the characteristic impedances of the two split lines become equal and therefore it is not possible to connect the two split transmission lines ($\lambda/8$ length) to the split transmission line ($\lambda/8$ length), so there is a clear difference in the mode of operation and advantageous effects of the present invention and the conventional example.

The above explanation was mainly made with reference to a high frequency transmission line circuit on an MIC, but the present invention may be applied to other circuits as well, for example, a high frequency transmission line circuit made of coaxial cables.

Figure 6:
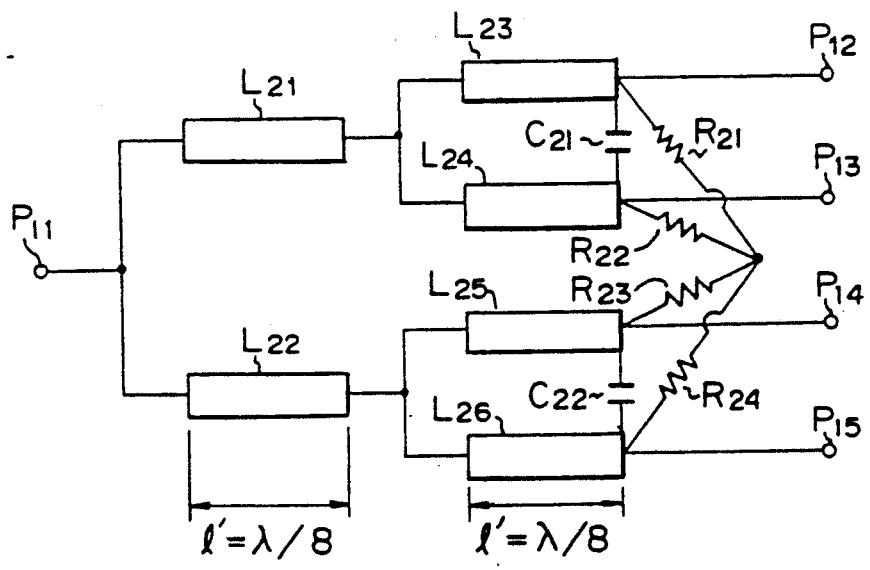
FIG. 6 is a view of an example of application of the present invention to a circuit other than an MIC.

FIG. 6 is a view of an example of application of the present invention to a circuit other than an MIC. The example illustrated corresponds to application of the first embodiment to the case of coaxial cables. Specifically, it is an example of use of coaxial cables for the $\lambda/8$ length transmission lines $L_{21}$ to $L_{26}$. Note that the resistors $R_{21}$ to $R_{24}$ and the capacitors $C_{21}$ and $C_{22}$ in the figure are for an isolation and use is made of ones of 100 $\Omega$ for the resistors $R_{21}$ to $R_{24}$ and ones having reactances of $|1/\omega c| = 200 \Omega$ for the capacitors $C_{21}$ and $C_{22}$. Here, $\omega$ equals $2\pi f$, that is, $\omega = 2\pi/\lambda$.

Figure 7:
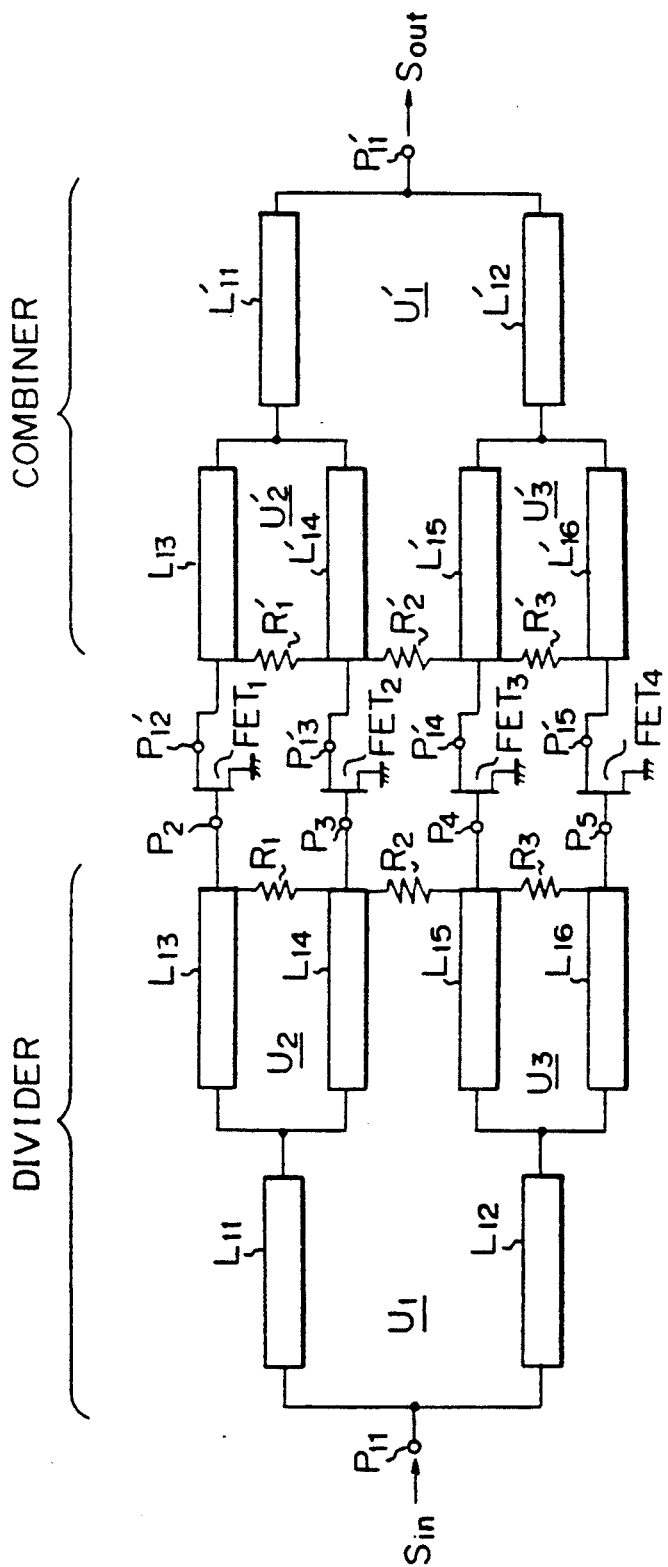
FIG. 7 is a view of the overall constitution of a power divider/combiner utilizing the present invention.

FIG. 7 is a view of the overall constitution of a power divider/combiner utilizing the present invention and corresponds to the above-mentioned FIG. 2.

In the above-mentioned embodiment, an example of application to 1→4 division (or 4→1 combination) is disclosed, but the present invention is not limited to such a number of divisions (or number of combinations). The point is that one high frequency signal is divided to $2^n$ number (n being 2, 3, 4 ...) of signals (or a single high frequency signal is combined from $2^n$ number of signals). For example, as shown in FIG. 8, it is possible to make n=3 and realize a $2^3$-way divider/$2^3$-way combiner.

Figure 8:
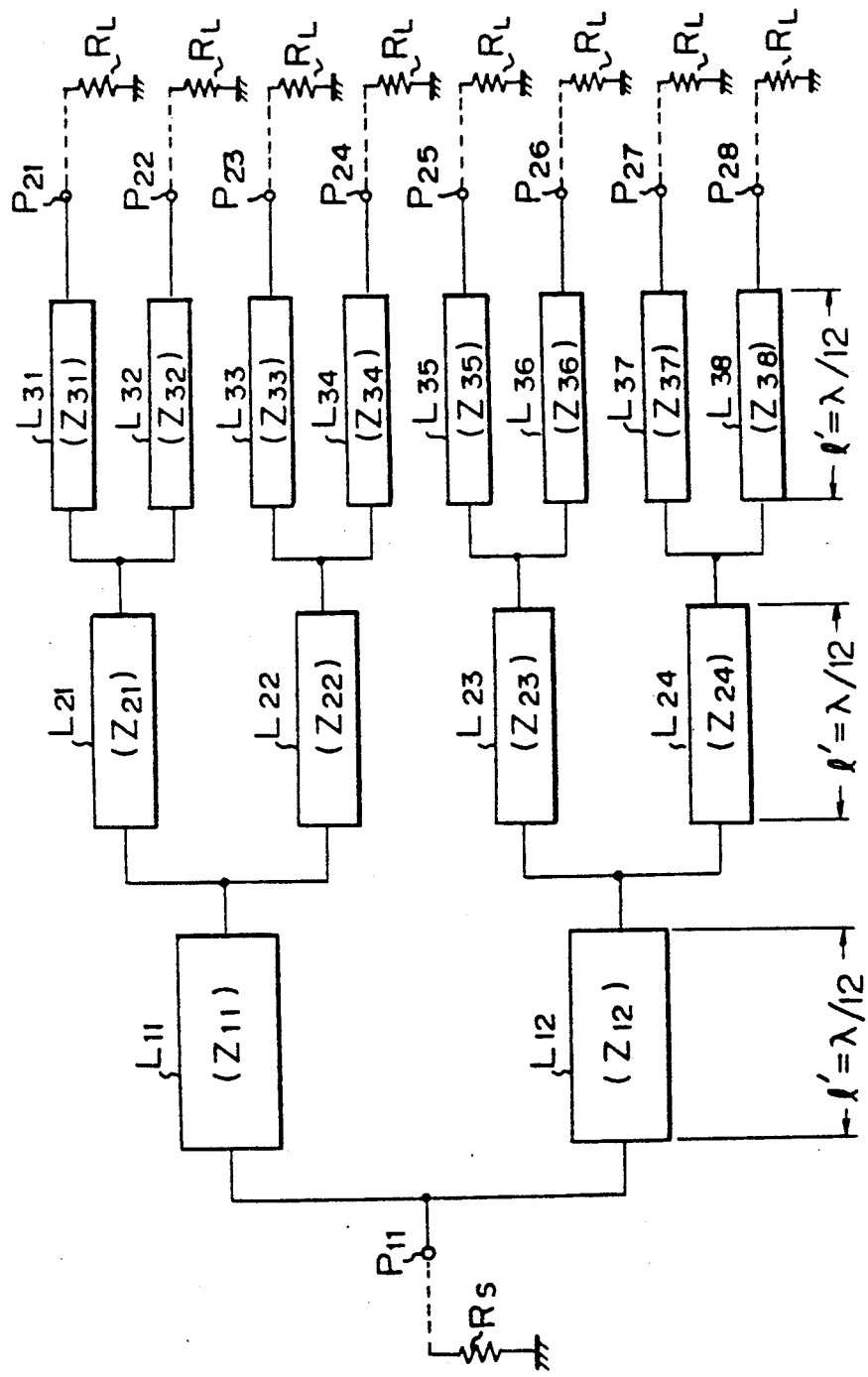
FIG. 8 is a view of the main constitution of a second embodiment of the present invention.

FIG. 8 is a view of the main constitution of a second embodiment of the present invention. While the first embodiment showed the example of realization of a $2^2$-way divider/$2^2$-way combiner, the second embodiment shown in FIG. 8 shows the main construction for realizing a $2^3$-way divider/$2^3$-way combiner. Since only the main construction is shown, the isolation resistors ($R_1$, $R_2$, and $R_3$ in FIG. 4), which are not critical to the invention, is omitted. L is a transmission line, Z is a characteristic impedance, and P is a port. The length l' of the transmission lines is $\lambda/12$.

The values of the characteristic impedances ($Z_{11}$ to $Z_{38}$) in the second embodiment are as follows:

$$Z_{11} = Z_{12} = \sqrt{\frac{R_S R_L}{2}}$$

$$Z_{21} = Z_{22} = Z_{23} = Z_{24} = \sqrt{2R_S R_L}$$

$$Z_{31} = Z_{32} = Z_{33} = Z_{34} = Z_{35} = Z_{36} = Z_{37} = Z_{38} = 2\sqrt{2R_S R_L}$$

From the above first embodiment and second embodiment, the construction of the present invention can be expressed further generally.

Figure 9:
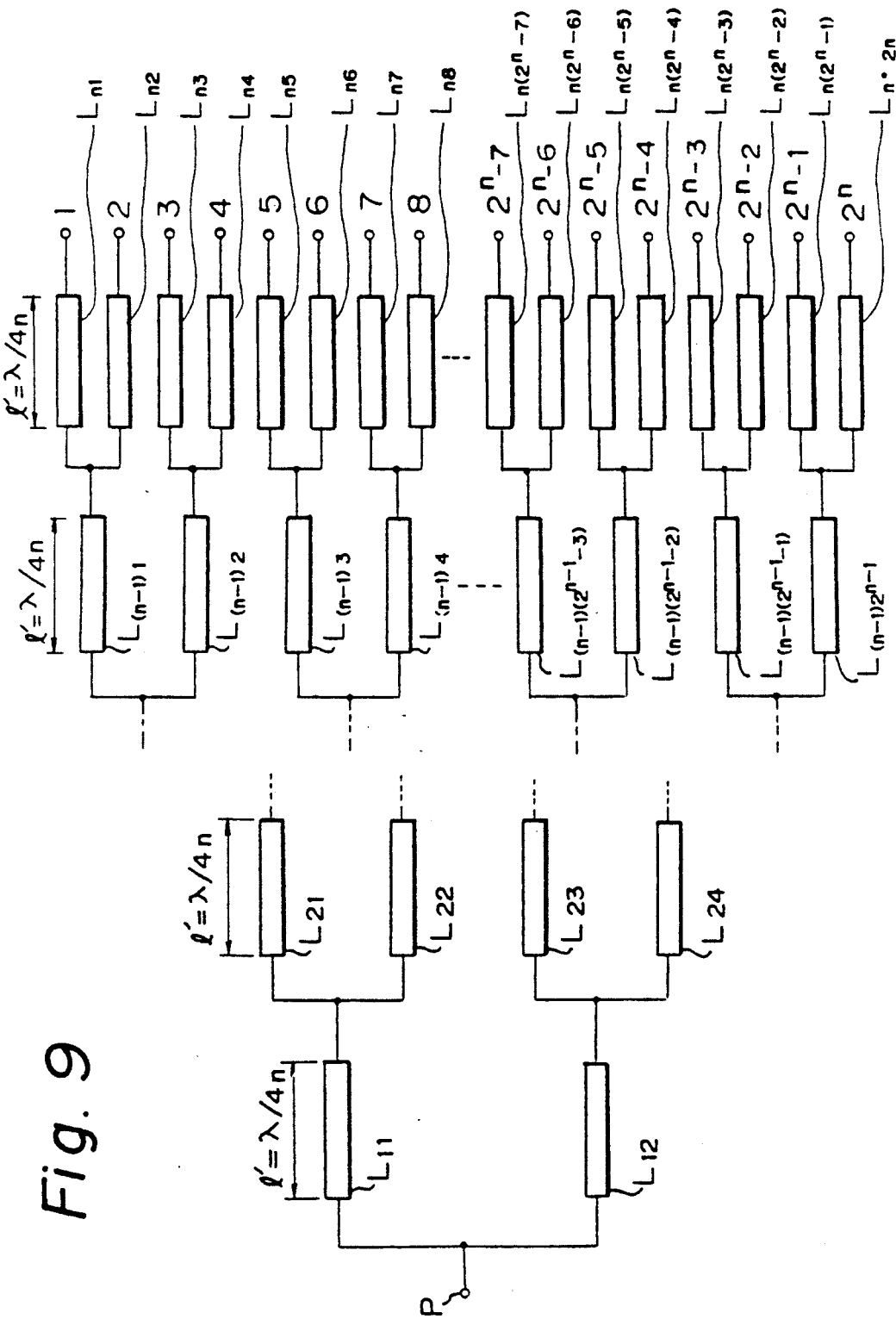
FIG. 9 is a view of the main constitution of a high frequency transmission line circuit based on the present invention, as applied to a $2^n$-way divider/$2^n$-way combiner.

FIG. 9 is a view of the main constitution of a high frequency transmission line circuit based on the present invention, as applied to a $2^n$-way divider/$2^2$-way combiner. In the construction of this figure, division is made from a single port P (left side) to the $2^n$ number (n=2, 3, 4 ...) of split ports (in the figure, 1, 2, 3, 4 ... $2^n-7$, $2^n-6$, ... $2^n$ shown at the right side of the figure).

The length (l') of the transmission lines (Lnn) is $\lambda/4n$.

The characteristic impedance of the first stage transmission lines $L_{11}$ and $L_{12}$ is $$\sqrt{\frac{R_S R_L}{2^{n-2}}}$$

and the characteristic impedance of the second stage transmission lines $L_{21}$, $L_{22}$, $L_{23}$, and $L_{24}$ is $$2\sqrt{\frac{R_S R_L}{2^{n-2}}}$$

That is, the characteristic impedance of one stage is in a 1:2 relationship with the characteristic impedance of the stage adjoining it, with the characteristic impedances of the transmission lines of the stage closer to the split ports being larger.

As explained above, according to the present invention, a high frequency transmission line circuit is realized which is made more compact in length, specifically, a small sized high frequency signal power divider/combiner suitable for use in an MIC can be realized.

We claim:

1. A high frequency transmission line circuit supplied with a high frequency signal, comprising:
   a first plurality of transmission line units arranged in a tournament configuration, each one of the plurality of transmission line units constituting two transmission lines, each transmission line having a length which is less than $80/4$, $\lambda$ being one wavelength of a frequency of the high frequency signal passing through the transmission line,
   respective first ends of said two transmission lines connecting in common to form a common end, while respective second ends of said two transmission lines form independent ends,
   each of said independent ends of one of said plurality of transmission line units connecting to said common end of another of said plurality of transmission line units, and thereby a divided input or combined output based on the high frequency signal is received by or produced from a single end side of said tournament configuration and combined inputs or distributed outputs based on the high frequency signal are received by or produced from a multiple end side of said multiple array, and
   characteristic impedances of any two transmission lines adjoiningly connected along a direction of passage of said high frequency signal being set such that the characteristic impedance of the transmission line at said multiple end side of the tournament configuration is larger than the characteristic impedance of the transmission line at said single end side of the tournament configuration, so that each of two parallely arranged adjoining ones of the plurality of transmission line units at the multiple end side of the tournament configuration are joined, at their commonly connected ends, to a serially arranged adjoining one of the plurality of transmission line units at the single end side thereof,
   a sum of lengths of the plurality of transmission lines arranged between a single end side of the tournament configuration and the multiple end side of the tournament configuration being $\lambda/4$, a number of split ports at the multiple end of the tournament configuration being $2^n$ (where n is 2, 3, 4, ...), and the length of each of the plurality of transmission lines being set to $\lambda/4n$.

2. A high frequency transmission line circuit as set forth in claim 1, wherein:

the multiple ends of the multiple end side constitute $2^n$ split ports, and isolation resistors are connected between two adjoining split ports in each of the $2^n$ split ports.

3. A high frequency transmission line circuit as set forth in claim 1, wherein said transmission lines are constituted by coaxial cables.

4. A high frequency transmission line circuit as set forth in claim 1, further comprising:

a second plurality of transmission line units identical to the first plurality of transmission line units, wherein:

the multiple end side of the tournament configuration of the first plurality of transmission line units is connected to a multiple end side of the tournament configuration of the second plurality of transmission line units, and the first and second pluralities of transmission line units constitute a $2^n$-way divider/$2^n$-way combiner set between a high frequency signal source of an impedance $R_S$ and a load of an impedance $R_L$, n stages of said transmission line units are arranged from the single end side to the multiple end side of the tournament configuration and the characteristic impedances of the transmission lines in the transmission line units of a stage at the multiple end side among the transmission line units of two adjoining stages are set to be about twice the characteristic impedances of the transmission lines in the units at a stage at the single end side.

5. A high frequency transmission line circuit as set forth in claim 4, wherein the characteristic impedance in the transmission line units at the single end side of each of the first and second pluralities of transmission line units is set to $$\sqrt{\frac{R_S R_L}{2^{n-2}}}$$

and the characteristic impedances of the transmission lines in the stages from the second stage on are set to approximately double the characteristic impedances at the stages just before.

6. A high frequency transmission line circuit as set forth in claim 4, wherein the multiple ends of the multiple end sides of each of the first and second pluralities of transmission line units constitute $2^n$ split ports, the high frequency transmission line circuit further comprising:

$2^n$ high frequency amplifiers provided with inputs connected to the $2^n$ split ports at the end side of the tournament configuration forming said $2^n$-way divider and with outputs connected to the $2^n$ split ports at the end side of the tournament configuration forming said $2^n$-way combiner, the high frequency signals input from the port at the single end side of the tournament configuration forming the said $2^n$-way divider being amplified in power to give a high power high frequency signal from the port at the single end side of the tournament configuration forming said $2^n$-way combiner.

7. A high frequency transmission line circuit as set forth in claim 1, wherein:

said high frequency transmission line circuit is formed as a microwave integrated circuit, and said transmission lines are formed as microstrip lines on an insulating substrate constituting said microwave integrated circuit.

8. A high frequency transmission line circuit as set forth in claim 7, wherein said characteristic impedances are set by adjusting physical factors, defining the characteristic impedances, of each material forming the high frequency transmission line circuit.

* * * * *